(12) United States Patent
Carcia

(10) Patent No.: US 6,756,160 B2
(45) Date of Patent: Jun. 29, 2004

(54) ION-BEAM DEPOSITION PROCESS FOR MANUFACTURING ATTENUATED PHASE SHIFT PHOTOMASK BLANKS

(75) Inventor: Peter Francis Carcia, Wilmington, DE (US)

(73) Assignee: E.I. du Pont de Nemours. and Company, Wilmington, DE (US)

( * ) Notice: Subject to any disclaimer, the term of this patent is extended or adjusted under 35 U.S.C. 154(b) by 177 days.

(21) Appl. No.: 10/123,724

(22) Filed: Apr. 16, 2002

(65) Prior Publication Data

US 2002/0187405 A1 Dec. 12, 2002

Related U.S. Application Data

(63) Continuation of application No. 60/284,780, filed on Apr. 19, 2001.

(51) Int. Cl.[7] .............................. G03F 9/00; C23C 14/00
(52) U.S. Cl. ........................................ 430/5; 204/192.25
(58) Field of Search .......................... 430/5; 428/432; 204/192.15, 192.22, 192.25

(56) References Cited

U.S. PATENT DOCUMENTS 4,890,309 A 12/1989 Smith et al.
5,897,977 A 4/1999 Carcia et al.
6,335,124 B1 * 1/2002 Mitsui et al. .................. 430/5
2002/0119378 A1 * 8/2002 Angelopoulos et al. ........ 430/5

FOREIGN PATENT DOCUMENTS

JP 03010074 1/1991
WO WO 00/42473 7/2000

OTHER PUBLICATIONS

David B. Fraser the Sputter and Gun Magnetrons. Thin Film Processes, 1978: pp. 115–116 vol. 11 Issue 3.

F.D. Falk et al Attenuated phase-shifting photomasks fabricated from Cr-based embedded shifter blanks– SPIE vol. 2254 Photomask and X-Ray Mask Technology (1994), pp. 64–70 Wilmington, DE.

Bruce W Smith et al Development and characterization of nitride and oxide based composite materials for sub 0 18 um attenuated phase shifting masking Microelectronic Engineering (1997) pp. 201–204 vol. 35 New York.

* cited by examiner

Primary Examiner—Stephen Rosasco

(57) ABSTRACT

An ion-beam deposition process for fabricating attenuating phase shift photomask blanks, capable of producing a phase shift of 180°, and which can provide tunable optical transmission at selected lithographic wavelengths <400 nm, comprising at least one layer of material of general formulae $M_zSiO_xN_y$ or $M_zAlO_xN_y$, is described.

8 Claims, 5 Drawing Sheets

Optical constants (n,k) for nitrogen-rich titanium silicon oxy-nitride films made by dual ion beam deposition.

Example 1: The measured chemical composition of the film is Ti(0.77)SiN(1.88)O(0.08)

Optical constants (n,k) for nitrogen-rich titanium silicon oxy-nitride films made by dual ion beam deposition.

Figure 1, Example 1: The measured chemical composition of the film is Ti(0.77)SiN(1.88)O(0.08)

Optical constants (n,k) for titanium silicon oxy-nitride films made by dual ion beam deposition.

Figure 2. Example 2: The measured chemical composition of the film is Ti(0.71)SiN(1.3)O(1.2)

Optical constants (n,k) for oxide-rich titanium silicon oxy-nitride films made by dual ion beam deposition.

Figure 3, Example 3: The measured chemical composition of the film is Ti(0.57)SiO(3.1)

ION-BEAM DEPOSITION PROCESS FOR MANUFACTURING ATTENUATED PHASE SHIFT PHOTOMASK BLANKS

FIELD OF INVENTION

This invention relates to manufacture of phase shift photomask blanks in photolithography, known in the art as the attenuating (embedded) type, using the ion-beam deposition technique. More specifically, this invention relates to photomask blanks to be used with short wavelength (i.e., <400 nanometer) light, which attenuate and change the phase of transmitted light by 180° relative to the incident light, and which provide tunable optical transmission. Additionally, this invention relates to photomask blanks with single or multi-layered coating of the general formula MxSiOyNz or MxAlOyNz on the blanks.

TECHNICAL BACKGROUND

Microlithography is the process of transferring microscopic circuit patterns or images, usually through a photomask, on to a silicon wafer. In the production of integrated circuits for computer microprocessors and memory devices, the image of an electronic circuit is projected, usually with an electromagnetic wave source, through a mask or stencil on to a photosensitive layer or resist, applied to the silicon wafer. Commonly, the mask is a layer of "chrome" patterned with these circuit features on a transparent quartz substrate. Often referred to as a "binary" mask, a "chrome" mask transmits imaging radiation through the pattern where "chrome" has been removed. The radiation is blocked in regions where the "chrome" layer is present.

The electronics industry seeks to extend optical lithography for manufacture of high-density integrated circuits to critical dimensions of less than 100 nm. However, as the feature size decreases, resolution for imaging the minimum feature size on the wafer with a particular wavelength of light is limited by the diffraction of light. Therefore, shorter wavelength light, i.e. <400 nm is required for imaging finer features. Wavelengths targeted for succeeding generations of optical lithography include 248 nm (KrF laser wavelength), 193 nm (ArF laser wavelength), and 157 nm ($F_2$ laser wavelength) and lower. However, as the wavelength of the incident light decreases, the "depth of focus," (DoF) or the tolerance of the process also decreases according to the following equation:

$$DoF=k_2(\lambda/NA^2)$$

where $k_2$ is a constant for a given lithographic process, $\lambda$ is the wavelength of the imaging light, and NA=sin θ, is the numerical aperture of the projection lens. A larger DoF means that the process tolerance toward departures in wafer flatness and photoresist thickness uniformity is greater.

Resolution and DoF can be improved for a given wavelength with a phase shift photomask which enhances the patterned contrast of small circuit features by destructive optical interference. Often a phase-shift mask can increase DOF. Therefore, as the minimum feature size in integrated circuits continues to shrink, the "phase-shift mask" becomes increasingly important in supplementing and extending the applications of traditional photolithography with "binary" masks. For example, in the attenuating (embedded) phase-shift mask, the electromagnetic radiation leaks through (attenuated) the unpatterned areas, while it is simultaneously phase-shifted 180°, instead of being blocked completely. Compared to "chrome" on quartz masks, phase-shift masks improve printing resolution of fine features and the depth of focus of the printing process.

The concept of a phase shift photomask and photomask blank that attenuates light and changes its phase was revealed by H. I. Smith in U.S. Pat. No. 4,890,309 ("Lithography Mask with a Pi-Phase Shifting Attenuator"). Common categories of known attenuating embedded phase shift photomask blanks include: (1) Cr-based photomask blanks containing Cr, Cr-oxide, Cr-carbide, Cr-nitride, Cr-fluoride or combinations thereof; and (2) $SiO_2$- or $Si_3N_4$-based photomask blanks, where $SiO_2$ or $Si_3N_4$ are doped with an opaque metal such as Mo to form a molybdenum silicon oxide, nitride, or an oxynitride.

Physical methods of thin film deposition are preferred to manufacture photomask blanks. These methods which are normally carried out in a vacuum chamber include glow discharge sputter deposition, cylindrical magnetron sputtering, planar magnetron sputtering, and ion beam deposition. A detailed description of each method can be found in the reference "Thin Film Processes," Vossen and Kern, Editors, Academic Press NY, 1978). The method for fabricating thin film masks is almost universally planar magnetron sputtering.

The planar magnetron sputtering configuration consists of two parallel plate electrodes: one electrode holds the material to be deposited by sputtering and is called the cathode; while the second electrode or anode is where the substrate to be coated is placed. An electric potential, either RF or DC, applied between the negative cathode and positive anode in the presence of a gas (e.g., Ar) or mixture of gases (e.g., $Ar+O_2$) creates a plasma discharge (positively ionized gas species and negatively charged electrons) from which ions migrate and are accelerated to the cathode, where they sputter or deposit the target material on to the substrate. The presence of a magnetic field in the vicinity of the cathode (magnetron sputtering) intensifies the plasma density and consequently the rate of sputter deposition.

If the sputtering target is elemental such as silicon (Si), sputtering with an inert gas such as Ar produces films of Si on the substrate. When the discharge contains reactive gases, such as $O_2$, $N_2$, or $CO_2$, they combine with the target/or at the growing film surface to form a thin film oxide, nitride, carbide, or combination thereof, on the substrate.

Whether the mask is "binary" or phase-shifting, the materials that comprise the mask-film are usually chemically complex, and sometimes the chemistry is graded through the film thickness, or is layered. Even a simple "chrome" mask is a chrome oxy-carbo-nitride (CrOxCyNz) composition that can be oxide rich at the film's top surface and more nitride-rich within the depth of the film. The chemistry of the top surface imparts anti-reflection character, while the chemical grading provides attractive anisotropic wet etch properties.

In the ion-beam deposition process (IBD), the plasma discharge is contained in a separate chamber (ion "gun" or source) and ions are typically extracted and accelerated by an electric potential impressed on a series of grids at the "exit port" of the gun (other ion-extraction schemes without grids are also possible). The IBD process provides a cleaner process (fewer added particles) at the growing film surface, as compared to planar magnetron sputtering because the plasma, that traps and transports charged particles to the substrate, is not in the proximity of the growing film. Additionally, the IBD process operates at a total gas pressure at least ten times lower than traditional magnetron sputtering processes. (A typical pressure for IBD is ~$10^{-4}$ Torr.) This results in reduced levels of chemical contamination; for example, a nitride film with minimum or no oxide content can be deposited by the IBD process. Furthermore, the IBD process has the ability to independently control the deposition flux and the reactive gas ion flux (current) and energy, which are coupled and not independently controllable in planar magnetron sputtering. The capability to grow oxides or nitrides or other chemical compounds with a separate ion gun that bombards the growing film with a low energy, but high flux of oxygen or nitrogen ions is unique to the IBD process and offers precise control of film chemistry and other film properties over a broad process range. Additionally, in a dual ion beam deposition the angles between the target, the substrate, and the ion guns can be adjusted to optimize for film uniformity and film stress, whereas the geometry in magnetron sputtering is constrained to a parallel plate electrode system.

While magnetron sputtering is extensively used in the electronics industry for reproducibly depositing all sorts of coatings, process control in sputtering plasmas is not accurate because the direction, energy, and flux of the ions incident on the growing film cannot be regulated. In ion beam deposition (IBD) proposed here, which is a novel alternative approach for fabricating masks with complex multi-layered chemistries, independent control of these deposition parameters is possible.

SUMMARY OF THE INVENTION

This invention concerns an ion-beam deposition process for preparing an attenuated, embedded phase shift photomask blank capable of producing 180° phase shift at lithographic wavelengths less than 400 nanometer, the process comprising depositing at least one layer of compound of the general formula of $M_zSiO_xN_y$ or $M_zAlO_xN_y$, where M is selected from transition metal groups of IVB, VB, VIB, and a combination thereof, on a substrate; by ion beam deposition from a target mixture, alloy, or compound of M and Si or M and Al by ions from a group of gases;
wherein:
  x ranges from about 0.00 to about 2.00;
  y ranges from about 0.00 to about 2.00;
  and z ranges from about 0.00 to about 2.00.

More specifically, this invention concerns a dual ion-beam deposition process for preparing an attenuated, embedded phase shift photomask blank capable of producing 180° phase shift at lithographic wavelengths less than 400 nanometer, the process comprising depositing at least one layer of compound of the general formula of $M_zSiO_xN_y$, where M is selected from transition metal groups of IVB, VB, VIB, and a combination thereof, on a substrate;
  (a) by ion beam deposition from a target mixture, alloy, or compound of M and Si by ions from a group of gases, and
  (b) by bombarding the said substrate by a secondary ion beam from an assist source comprising a group of gases, wherein the layer or layers are formed by a chemical combination of the bombarding gas ions from the assist source gas with the material deposited from the target or targets onto the substrate:
  wherein:
    x ranges from about 0.00 to about 2.00;
    y ranges from about 0.00 to about 2.00;
    and z ranges from about 0.00 to about 2.00.

This invention also concerns a dual ion-beam deposition process for preparing an attenuated, embedded phase shift photomask blank capable of producing 180° phase shift at lithographic wavelengths less than 400 nanometer, the process comprising: depositing at least one layer of compound of the general formula of $M_zAlO_xN_y$, where M is selected from transition metal groups of IVB, VB, VIB, and a combination thereof, on a substrate;
  (a) by ion beam deposition from a target mixture, alloy or compound of M and Al by ions from a group of gases, and
  (b) by bombarding the said substrate by a secondary ion beam from an assist source comprising a group of gases, wherein the layer or layers are formed by a chemical combination of the bombarding gas ions from the assist source gas with the material deposited from the target or targets onto the substrate:
  wherein:
    x ranges from about 0.00 to about 2.00;
    y ranges from about 0.00 to about 2.00;
    and z ranges from about 0.00 to about 2.00.

DETAILED DESCRIPTION OF THE INVENTION

Certain terms that are used herein are defined below.

In this invention, it is to be understood that the term "photomask" or the term "photomask blank" is used herein in the broadest sense to include both patterned and UN-patterned photomask blanks.

Single Ion Beam Deposition Process

A typical configuration for a single ion beam deposition process is shown in FIG. 5. It is understood that this system is in a chamber with atmospheric gases evacuated by vacuum pumps. In the single IBD process, an energized beam of ions (usually neutralized by an electron source) is directed from a deposition gun (1) to a target material (2), supported by a target holder (3) and the target is sputtered when the bombarding ions have energy above a sputtering threshold energy for that specific material, typically ~50 eV. The ions from the deposition-gun (1) are usually from an inert gas source such as He, Ne, Ar, Kr, Xe, although reactive gases such as $O_2$, $N_2$, $CO_2$, $F_2$, $CH_3$, or combinations thereof, can also be used. When these ions are from an inert gas source the target material (2) is sputtered and then deposits as a film on the substrate (4), on substrate holder (5). When these ions are from a reactive gas source, they can combine with target material (2) and the product of this chemical combination is what is sputtered and deposited as a film on the substrate (4).

Commonly, the bombarding ions should have energies of several hundred eV—a range of 200 eV to 10 KeV being preferred. The ion flux or current should be sufficiently high ($>10^{13}$ ions/cm$^2$/s) to maintain practical deposition rates (>0.1 nm/min). Typically, the process pressure is about $10^{-4}$ Torr, with a preferred range $10^{-3}$–$10^{-5}$ Torr. The target material can be elemental, such as Si, Ti, Mo, Cr, or it can be multi-component such as $Mo_xSi_y$, or it can be a compound such as $SiO_2$. The substrate can be positioned at a distance and orientation to the target that optimize film properties such as thickness, uniformity and minimum stress.

The process window or latitude for achieving one film property, for example, optical transparency, can be broadened with the dual ion-beam deposition process, described below. Also, one particular film property can be changed independently of other set of properties with the dual ion-beam process.

Dual Ion-Beam Deposition Process

The ion-beam process embodies in photomask manufacture a process with fewer added (defect) particles, greater film density with superior opacity, and superior smoothness with reduced optical scattering, especially for lithographic wavelength<400 nm. The dual ion gun configuration is shown schematically in FIG. 4. In this process, an energetic beam of ions (usually neutralized by an electron source) is directed from a deposition gun (1) to a target (2), which is sputtered when the bombarding ions have energy above a sputtering threshold, typically ~50 eV. The ions from the deposition-gun are usually from an inert gas source such as He, Ne, Ar, Kr, Xe, although reactive gases such as $O_2$, $N_2$, $CO_2$, $F_2$, $CH_3$, or combinations thereof, can also be used. When these ions are from an inert gas source they sputter the target material, e.g., silicon, which deposits as a film on the substrate. When these gas ions are from a reactive source, e.g. oxygen, they can chemically combine at the target surface and then the product of this chemical combination is what is sputtered and deposited as a film on the substrate. In dual ion beam deposition, energetic ions from a second gun or assist source (6) bombard the substrate (4). Commonly, ions from the assist gun (6) are selected from the group of reactive gases such as, but not restricted to O2, $N_2$, $CO_2$, $F_2$, $CH_3$, or combinations thereof, which chemically combine at the substrate (4) with the flux of material sputtered from the target (2). Therefore, if Ar ions from the deposition gun are used to sputter a silicon target while oxygen ions from the assist source bombard the growing film, the Si flux will chemically combine with energetic oxygen ions at the substrate, forming a film of silicon oxide.

Commonly, the bombarding ions from the deposition source should have energies of several hundred eV—a range of 200 eV to 10 KeV being preferred. The ion flux or current should be sufficiently high (>$10^{13}$ ions/cm$^2$/s) to maintain practical deposition rates (>0.1 nm/min). Typically, the process pressure is about $10^{-4}$ Torr, with a preferred range $10^{-3}$–$10^{-5}$ Torr. The preferred target materials of this invention are mixtures, alloys, or compounds of silicon or aluminum with metals from Groups IVB, VB, VIB of the periodic table, or combinations thereof. The substrate can be positioned at a distance and orientation to the target that optimize film properties such as thickness uniformity, minimum stress, etc. The energy of ions from the assist gun is usually lower than the deposition gun. The assist gun provides an adjustable flux of low energy ions that react with the sputtered atoms at the growing film surface. For the "assist" ions, lower energy typically <500 eV is preferred, otherwise the ions may cause undesirable etching or removal of the film. In the extreme case of too high a removal rate, film growth is negligible because the removal rate exceeds the accumulation or growth rate. However, in some cases, higher assist energies may impart beneficial properties to the growing film, such as reduced stress, but the preferred flux of these more energetic ions is usually required to be less than the flux of depositing atoms.

In dual ion beam deposition of photomask blanks the gas ion source for the deposition process is preferably selected from the group of inert gases including, but not restricted to He, Ne, Ar, Kr, Xe or combinations thereof, while the gas ion source for the assist bombardment is preferably selected from the group of reactive gases including, but not restricted to $O_2$, $N_2$, $CO_2$, $F_2$, $CH_3$, or combinations thereof. However, in special circumstances the deposition gas source may also contain a proportion of a reactive gas, especially when formation of a chemical compound at the target is favorable for the process. Conversely, there may be special circumstances when the assist gas source is comprised of a proportion of an inert gas, especially when energetic bombardment of the growing film is favorable for modifying film properties, such as reducing internal film stress.

The capability to grow oxides or nitrides or other chemical compounds with a separate assist ion gun that bombards the growing film with a low energy, but high flux of oxygen or nitrogen ions is unique to the IBD process and offers precise control of film chemistry and other film properties over a broad process range. Additionally, in dual ion beam deposition the angles between the target, the substrate, and the ion guns can be adjusted to optimize for film uniformity and film stress, whereas the geometry in magnetron sputtering is constrained to a parallel plate electrode system.

With the dual IBD process, any of these deposition operations can be combined to make more complicated structures. For example a SiOx/SiNy layered stack can be made by depositing from elemental Si target as the film is successively bombarded first by reactive nitrogen ions from the assist gun, followed by bombardment with oxygen ions. When the layers in a stack alternate from an oxide to a nitride as in SiOx/SiNy, dual ion beam deposition with a single Si target offers significant advantage over traditional magnetron sputtering techniques. Whereas the assist source in dual IBD can be rapidly switched between $O_2$ and $N_2$ as Si atoms are deposited, reactive magnetron sputtering produces an oxide layer on the target surface that must be displaced before forming a nitride-rich surface for sputtering a nitride layer. Further, combining an oxide layer with a nitride can improve optical contrast at longer wavelength, important for inspection of the patterned photomask relative to quartz. Whereas the optical properties of metal oxides and nitrides may be equivalent at lithographic wavelengths, and thus optical transmission is the same, current inspection tools working at longer wavelength, e.g. 488 nm and 365 nm, where metal nitrides are more optically absorbing than their corresponding oxides, and thus provide higher optical contrast there, an advantage for inspection and repair of patterned photomasks.

While it is possible to make films with complex chemical compounds, such as $Si_3N_4$, with ion beam deposition using a single ion source, the process is more restrictive than for dual ion beam deposition. For example, Huang et al. in "Structure and composition studies for silicon nitride thin films deposited by single ion beam sputter deposition" *Thin Solid Films* 299 (1997) 104–109, demonstrated that films with $Si_3N_4$ properties only form when the beam voltage is in a narrow range about 800 V. In dual ion beam sputtering the flux of nitrogen atoms from the assist source can be adjusted independently to match the flux of deposited target atoms from the deposition ion source over a wide range of process conditions and at practical deposition rates.

This invention relates to the dual ion beam deposition process for depositing a single layer or multiple layers of compounds of the general formula of, MzSiOxNy or MzAlOxNy, where M is selected from transition metal groups of IVB, VB, and VIB, where x ranges from about 0.00 to about 2.00, y ranges from about 0.00 to about 2.00, and z ranges from about 0.00 to 2.00.

In a preferred dual ion beam deposition process, ions from the deposition-gun are from a group of gases consisting of He, Ne, Ar, Kr, Xe, $O_2$, $N_2$, $CO_2$, $F_2$, $CH_3$, or combinations thereof. In a more preferred dual ion beam deposition process, the ions from the deposition-gun are from a group of gases consisting of He, Ne, Ar, Kr, Xe, $O_2$, $N_2$, or combinations thereof. In a further preferred dual ion beam deposition process, the ions from the deposition-gun are from a group of gases consisting of He, Ne, Ar, Kr, Xe or combinations thereof.

In a preferred dual ion beam deposition process, ions from the assist-gun are from a group of gases consisting of He, Ne, Ar, Kr, Xe, $O_2$, $N_2$, $CO_2$, $F_2$, $CH_3$, or combinations thereof. In a more preferred dual ion beam deposition process, the ions from the assist-gun are from a group of gases consisting of $O_2$, $N_2$, $CO_2$, $F_2$, $CH_3$, or combinations thereof. In a further preferred dual ion beam deposition process, the ions from the assist-gun are from a group of gases consisting of $O_2$, $N_2$, or combinations thereof.

This invention provides a novel deposition technique of single or multiple layer film for photomask blanks for incident wavelengths less than 400 nm. The substrate can be any mechanically stable material which is transparent to the wavelength of incident light used. Substrates such as quartz and fused silica (glass), and $CaF_2$ are preferred for availability and cost.

Optical Properties

The optical properties (index of refraction, "n" and extinction coefficient, "k") were determined from variable angle spectroscopic ellipsometry at three incident angles from 186–800 nm, corresponding to an energy range of 1.5–6.65 eV, in combination with optical reflection and transmission data. From knowledge of the spectral dependence of optical properties, the film thickness corresponding to 180° phase shift, optical transmissivity, and reflectivity can be calculated. See generally, O. S. Heavens, *Optical Properties of Thin Solid Films*, pp 55–62, Dover, N.Y., 1991, incorporated herein by reference.

EXAMPLES

Example 1

Figure 1:
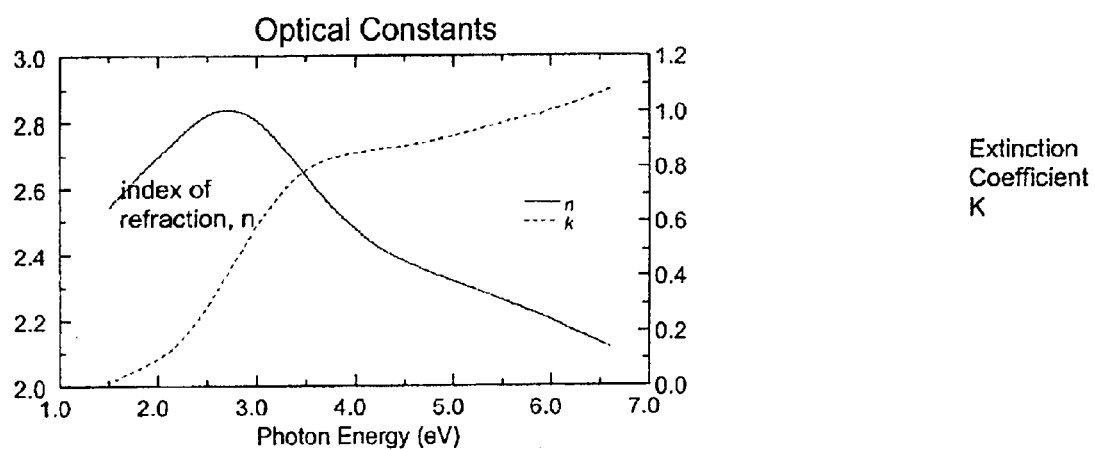
FIG. 1: Optical constants (n,k) for titanium silicon oxy-nitrides films made by dual ion beam deposition; Example 1.

Titanium silicon nitride films were made by dual ion beam deposition in a commercial tool (Commonwealth Scientific) from a $TiSi_2$ target. Deposition from $TiSi_2$ was carried out with one ion beam deposition source operating at a voltage of 1200 V and a beam current of 25 mA, simultaneously nitriding the growing film with $N_2$ ions from a second assist ion beam source, operating at 70 V. 20.6 sccm of Ar were used in the deposition source, while $N_2$ at 7 sccm were used in the assist source. The substrates were Si and quartz. Deposition for 90 minutes produced a film 1175 A thick with chemical composition of Ti(0.77)SiN(1.88)O(0.08), as determined from X-ray photoelectron spectroscopy. FIG. 1 shows the spectral dependence of optical constants, determined by spectroscopic ellipsometry.

Example 2

Figure 2:
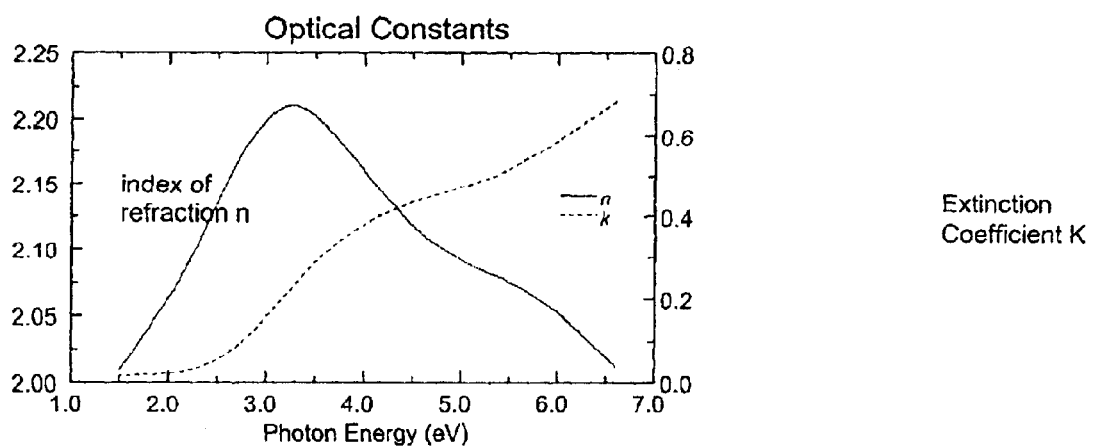
FIG. 2: Optical constants (n,k) for titanium silicon oxy-nitrides films made by dual ion beam deposition; Example 2.

Titanium silicon oxy-nitride films were made by dual ion beam deposition in a commercial tool (Commonwealth Scientific) from a $TiSi_2$ target. Deposition from $TiSi_2$ was carried out with one ion beam deposition source operating at a voltage of 1200 V and a beam current of 25 mA, while the growing film was bombarded by ions from a 10% $O_2$/90% $N_2$ gas mixture from a second assist ion beam source, operating at 70 V. 16.6 sccm of Ar were used in the deposition source, while the flow rate of the $O_2/N_2$ mixture was 2.9 sccm in the assist source. The substrates were Si and quartz. Deposition for 61 minutes produced a film 840 A thick with chemical composition of Ti(0.71)SiN(1.3)O(1.2), as determined from X-ray photoelectron spectroscopy. FIG. 2 shows the spectral dependence of optical constants, determined by spectroscopic ellipsometry.

Example 3

Figure 3:
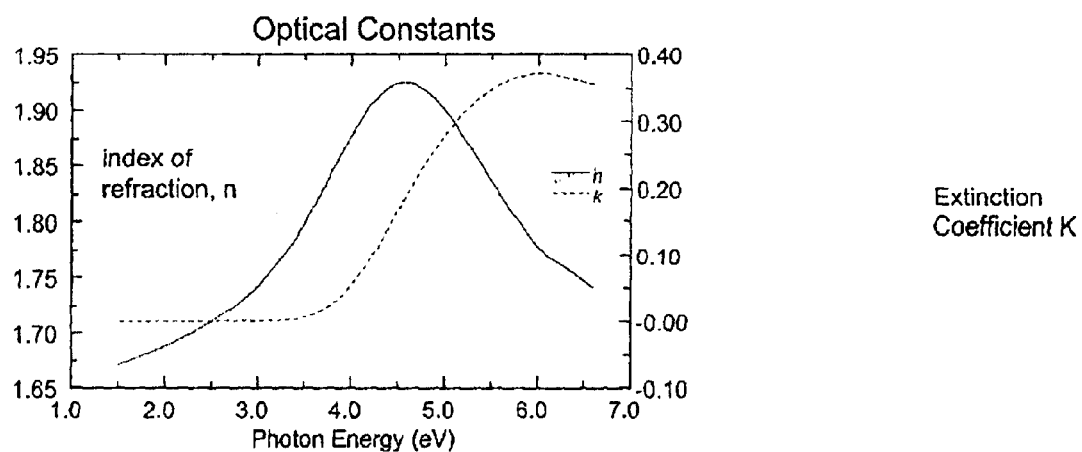
FIG. 3: Optical constants (n,k) for titanium silicon oxy-nitrides films made by dual ion beam deposition; Example 3.
Figure 4:
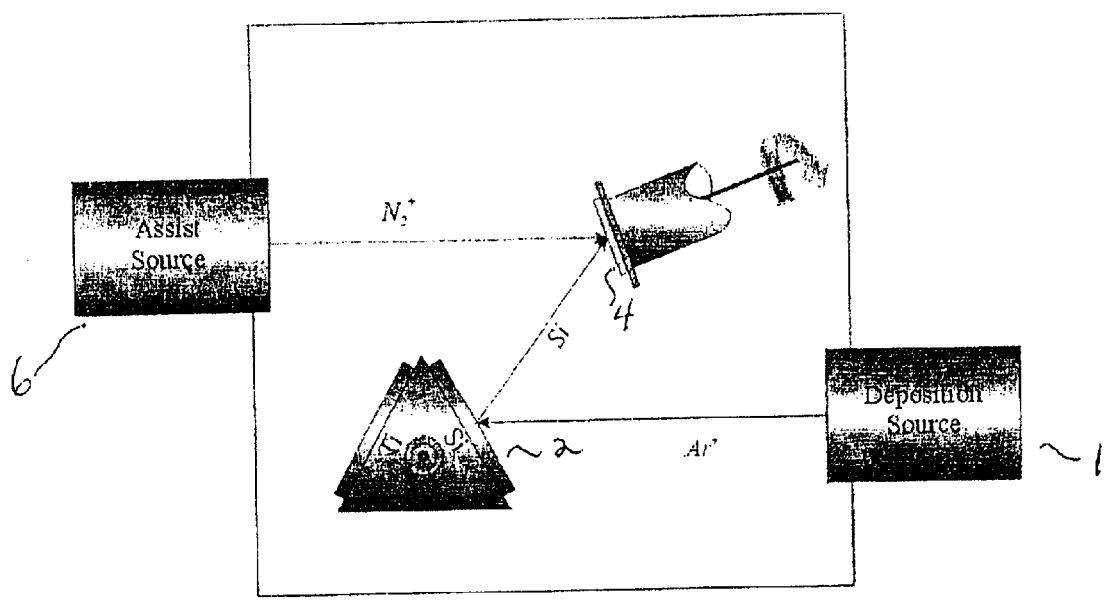
FIG. 4: Schematic of the Dual Ion-Beam Deposition Process.
Figure 5:
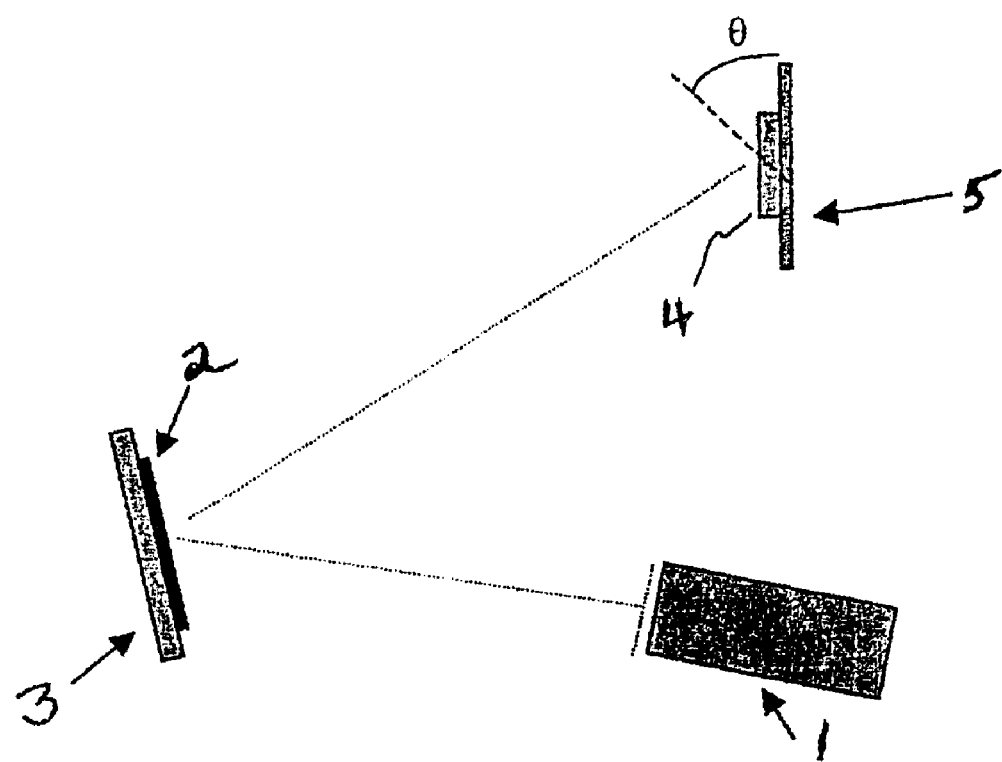
FIG. 5: Representation of single ion beam deposition process for silicon nitride, using silicon (Si) target with sputtered by nitrogen and argon ions from a single ion source or "gun".

Titanium silicon oxide films were made by dual ion beam deposition in a commercial tool (Commonwealth Scientific) from a $TiSi_2$ target. Deposition from $TiSi_2$ was carried out with one ion beam deposition source operating at a voltage of 1200 V and a beam current of 25 mA, simultaneously oxidizing the growing film with oxygen ions from a second assist ion beam source, operating at 70 V. 16.6 sccm of Ar were used in the deposition source, while the flow rate of the $O_2$ was 3 sccm in the assist source. The substrates were Si and quartz. Deposition for 58 minutes produced a film 208 A thick with chemical composition of Ti(0.57)SiO(3.1), as determined from X-ray photoelectron spectroscopy. FIG. 3 shows the spectral dependence of optical constants, determined by spectroscopic ellipsometry.

These three examples follow the trend in optical properties for below 400 nm or greater than 3.1 eV in energy that increasing the oxide content in titanium silicon oxy-nitride films reduces the index of refraction and also reduces the extinction coefficient.

In Table 1 we calculate the thickness for 180° phase-shift and optical transmission for phase-shift mask designs at 248 nm (5 eV) with chemistry and optical constants (n, k) corresponding to Examples 1, 2, and 3. For these designs we used the equations;

$$d=\lambda/2(n-1)$$

and $$T=(1-R)^2\exp(-4\pi kd/\lambda),$$

where d is the thickness of the deposited layer, T is the % transmission with respect to incident radiation, n and k are the material optical constants, R is the reflection coefficient estimated to be about 10% and λ is the wavelength, which is chosen to be 248 nm. From these data it is apparent that phase-shift masks with these chemistries can be designed for 248 nm (5 eV) with optical transmission in the range 1–12%, useful for application as embedded phase-shift masks. Optical transmissions at this and other wavelengths can be further increased by reducing the metal (Ti) content in the target.

TABLE 1

Phase-shift designs for 248 nm

| Chemistry | d (180°) | % T (248 nm) |
| --- | --- | --- |
| EXAMPLE 1 | 954 A° | 1.0 |
| EXAMPLE 2 | 1138 A° | 5.0 |
| EXAMPLE 3 | 1378 A° | 12.2 |

What is claimed is:

1. A dual ion-beam deposition process for preparing an attenuated, embedded phase shift photomask blank capable of producing 180° phase shift at lithographic wavelengths less than 400 nanometer, the process comprising depositing at least one layer of compound of the general formula of MzSiOxNy, where M is selected from transition metal groups of IVB, VB, VIB, and combinations thereof, on a substrate;

(a) by ion beam deposition from a target mixture, alloy or compound of M and Si by ions from a group of gases, and (b) by bombarding the said substrate by a secondary ion beam from an assist source comprising a group of gases, wherein the layer or layers are formed by a chemical combination of the bombarding gas ions from the assist source gas with the material deposited from the target or targets onto the substrate:

wherein:

x ranges from about 0.00 to about 2.00;

y ranges from about 0.00 to about 2.00;

and z ranges from about 0.00 to about 2.00.

2. A dual ion-beam deposition process for preparing an attenuated, embedded phase shift photomask blank capable of producing 180° phase shift at lithographic wavelengths less than 400 nanometer, the process comprising depositing at least one layer of compound of the general formula of MzAlOxNy, where M is selected from transition metal groups of IVB, VB, VIB, and combinations thereof, on a substrate;

(a) by ion beam deposition from a target mixture, alloy or compound of M and Al by ions from a group of gases, and (b) by bombarding the said substrate by a secondary ion beam from an assist source comprising a group of gases, wherein the layer or layers are formed by a chemical combination of the bombarding gas ions from the assist source gas with the material deposited from the target or targets onto the substrate:

wherein:

x ranges from about 0.00 to about 2.00;

y ranges from about 0.00 to about 2.00;

and z ranges from about 0.00 to about 2.00.

3. The process of claim 1, where the gases in step (a) are selected from the group consisting of He, Ne, Ar, Kr, Xe, $N_2$, $O_2$, $CO_2$, $N_2O$, $H_2O$, $NH_3$, $CF_4$, $CH_4$, $C_2H_2$, $CH_3$, and a combination of gases thereof.

4. The process of claim 1, where the gases in step (b) are selected from the group consisting of He, Ne, Ar, Kr, Xe, $N_2$, $O_2$, $CO_2$, $N_2O$, $H_2O$, $NH_3$, $CF_4$, $CH_4$, $C_2H_2$, $CH_3$, and a combination of gases thereof.

5. The process of claim 2, where the gases in step (a) are selected from the group consisting of He, Ne, Ar, Kr, Xe, $N_2$, $O_2$, $CO_2$, $N_2O$, $H_2O$, $NH_3$, $CF_4$, $CH_4$, $C_2H_2$, $CH_3$, and a combination of gases thereof.

6. The process of claim 2, where the gases in step (b) are selected from the group consisting of He, Ne, Ar, Kr, Xe, $N_2$, $O_2$, $CO_2$, $N_2O$, $H_2O$, $NH_3$, $CF_4$, $CH_4$, $C_2H_2$, $CH_3$, and a combination of gases thereof.

7. The photomask blank made as in claim 1, wherein the selected lithographic wavelength is selected from the group consisting of 157 nm, 193 nm, 248 nm, and 365 nm.

8. The photomask blank made as in claim 2, wherein the selected lithographic wavelength is selected from the group consisting of 157 nm, 193 nm, 248 nm, and 365 nm.

* * * * *